(12) United States Patent
Suzuki et al.

(10) Patent No.: US 7,745,246 B2
(45) Date of Patent: Jun. 29, 2010

(54) METHOD OF FABRICATING LIGHT EMITTING DEVICE

(75) Inventors: Yukari Suzuki, Annaka (JP); Hitoshi Ikeda, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 251 days.

(21) Appl. No.: 11/921,117

(22) PCT Filed: May 29, 2006

(86) PCT No.: PCT/JP2006/310649

§ 371 (c)(1),
(2), (4) Date: Nov. 27, 2007

(87) PCT Pub. No.: WO2006/129595

PCT Pub. Date: Dec. 7, 2006

(65) Prior Publication Data

US 2009/0275154 A1 Nov. 5, 2009

(30) Foreign Application Priority Data

May 31, 2005 (JP) ............................. 2005-160259

(51) Int. Cl.
*H01L 21/00* (2006.01)
(52) U.S. Cl. .............................. 438/47; 438/23; 438/24; 438/29; 438/32; 438/33; 438/42; 438/43; 438/46
(58) Field of Classification Search .................. 438/23, 438/24, 29, 32, 33, 42, 43, 46, 47
See application file for complete search history.

(56) References Cited

U.S. PATENT DOCUMENTS

| 6,465,812 | B1 | 10/2002 | Hosoba et al. | |
| 6,777,257 | B2 * | 8/2004 | Shinohara et al. | 438/45 |
| 6,791,117 | B2 | 9/2004 | Yoshitake et al. | |
| 7,037,738 | B2 | 5/2006 | Sugiyama et al. | |
| 7,145,180 | B2 * | 12/2006 | Shinohara et al. | 257/85 |
| 7,579,205 | B2 * | 8/2009 | Ikeda et al. | 438/46 |

FOREIGN PATENT DOCUMENTS

| EP | 1 061 590 A1 | 12/2000 |
| JP | 4-315479 | 11/1992 |
| JP | 5-167101 | 7/1993 |

(Continued)

*Primary Examiner*—Kevin M Picardat
*Assistant Examiner*—Bac H Au
(74) *Attorney, Agent, or Firm*—Oliff & Berridge, PLC

(57) ABSTRACT

A light emitting device wafer is fabricated, having a light emitting layer section, composed of AlGaInP, based on a double heterostructure and a GaP light extraction layer disposed on the light emitting layer portion, having a first main surface thereof appearing on the first main surface of the wafer, so as that a P-rich off-angled {100} surface, having a higher existence rate of P atoms than an exact {100} surface, appears on the first main surface the GaP light extraction layer. The main first surface of the GaP light extraction layer is etched with an etching solution FEA so as to form surface roughening projections. Therefore, it provides a method of fabricating a light emitting device capable of applying surface roughening easily to the GaP light extraction surface having the {100} surface, off-angled to be P-rich, as a main surface thereof.

8 Claims, 8 Drawing Sheets

FOREIGN PATENT DOCUMENTS

| | | |
|---|---|---|
| JP | 8-102548 | 4/1996 |
| JP | 8-115893 | 5/1996 |
| JP | 2780744 | 7/1998 |
| JP | 11-162885 | 6/1999 |
| JP | 2000-196141 | 7/2000 |
| JP | 2001-168382 | 6/2001 |
| JP | 2002-359399 | 12/2002 |
| JP | 2003-209283 | 7/2003 |
| JP | 2003-218383 | 7/2003 |
| WO | WO 00/41249 | 7/2000 |

* cited by examiner $\beta = 70.5°$
$\phi = 54.7°$ $\beta = 109.4°$
$\phi = 35.3°$

STEP 1

STEP 2

STEP 3

STEP 4

STEP 5

STEP 6

METHOD OF FABRICATING LIGHT EMITTING DEVICE

RELATED APPLICATIONS

This application claims the priority of Japanese Patent Application No. 2005-160259 filed on May 31, 2005, which is incorporated herein by reference.

BACKGROUND OF THE INVENTION

1. Field of the Invention

This invention relates to a method of fabricating a light emitting device.

2. Description of the Related Art

[Patent Document 1] Japanese Laid-Open Patent Publication No. 2003-218383

[Patent Document 2] Japanese Laid-Open Patent Publication No. 2003-209283

[Patent Document 3] Japanese Patent Publication No. 2780744

[Patent Document 4] Japanese Laid-Open Patent Publication No. H8-115893

[Patent Document 5] Japanese Laid-Open Patent Publication No. H5-167101

[Patent Document 6] Japanese Laid-Open Patent Publication No. H8-102548

Light emitting device having a light emitting layer section thereof composed of an $(Al_xGa_{1-x})_yIn_{1-y}P$ alloy (where, $0 \leq x \leq 1$, $0 \leq y \leq 1$; simply referred to as AlGaInP alloy, or more simply as AlGaInP, hereinafter) can be realized as a high-luminance device over a wide wavelength range typically from green region to red region, by adopting a double heterostructure in which a thin AlGaInP active layer is sandwiched between an n-type AlGaInP cladding layer and a p-type AlGaInP cladding layer, both having a larger band gap than the active layer. Current is supplied to the light emitting layer section through a metal electrode formed on the surface of the device. The metal electrode acts as a light interceptor, so that it is formed, for example, so as to cover only the center portion of a main surface (that is defined as a first main surface hereinafter) as a light extraction side of the light emitting layer section, to thereby extract light from the peripheral region having no electrode formed thereon.

In this case, a smaller area of the metal electrode is advantageous in terms of improving the light extraction efficiency, because it can ensure a larger area for the light extraction region formed around the electrode. Conventional efforts have been made on increasing the amount of light extraction by effectively spreading current within the device through consideration on geometry of the electrode, but increase in the electrode area is inevitable anyhow in this case, having been fallen in a dilemma that a smaller light extraction area results in a limited amount of light extraction. Another problem resides in that the current is less likely to spread in the in-plane direction, because the dopant carrier concentration, and consequently the conductivity, of the cladding layer is suppressed to a slightly lower level in order to optimize emissive recombination of carriers in the active layer. This results in concentration of the current into the region covered by the electrode, and consequently lowers the substantial amount of light extraction from the light extraction region. There has been adopted a method of forming, between the cladding layer and the electrode, a low-resistivity current spreading layer having a dopant concentration larger than that of the cladding layer. The current spreading layer, formed as a light extraction layer increased in the thickness to a certain degree, is not only successful in improving the in-plane current spreading effect, but also in increasing extractable amount of light from the side faces of the layer to thereby raise the light extraction efficiency. It is necessary for the light extraction layer to be formed using a compound semiconductor having a band gap energy larger than a light quantum energy of the beam of emitted light, for the purpose of efficient transmission of the beam of emitted light and raising the light extraction efficiency. In particular, GaP is widely used for composing the light extraction layer of AlGaInP-base light emitting device, by virtue of its large band gap energy and small absorption of the beam of emitted light.

In thus-configured light emitting device using the peripheral region of the metal electrode on the first main surface of the light extraction layer as the light extraction area, not all components of the emitted light directed from inside of the device towards the light extraction area can be extracted, because some components incident on the light extraction area at an angle (angle of incidence herein means an angle of the direction of incidence of beam away from the normal line on the area) larger than the critical angle returns back inside the device by total reflection. The Patent Documents 1-3 disclose techniques of roughening (also referred to as frosting) the first main surface of the light extraction layer using an appropriate etching solution so as to form fine irregularities, aiming at reducing probability of incidence of the beam of emitted light at large angles and at consequently raising the light extraction efficiency. Also, as another technique, the Patent Documents 5 and 6 disclose a technique of epitaxially growing, on a current spreading layer, a light scattering layer composed of compound semiconductor having a different lattice constant from that of the current spreading layer, so as to form irregularities on the light scattering layer resulting from lattice mismatching of the both layers.

The Patent document 1, however, discloses that the surface roughening using the etching solution can roughen some surfaces but cannot roughen other surfaces depending on orientation of the exposed surface, and upper surface roughening is therefore not always successfully done, so that improvement in the light extraction efficiency is achievable only to a limited degree, and further improvement in the luminance is not easy. The Patent document 2 more specifically discloses that "the main surface of semiconductor substrate generally shows the {100} surface or a surface several degrees off-angled from the {100} surface, so that the surface of any of the individual semiconductor layers grown thereon has also the {100} surface or a surface several degrees off-angled from the {100} surface, wherein it is difficult to roughen the {100} surface and the surface several degrees off-angled from the {100} surface". The light extraction layer disclosed in the Patent documents 2 and 3 is a GaAlAs layer, whereas the Patent document 1 discloses a GaP light extraction layer, having again the {100} surface exposed on the first main surface thereof.

Putting all aspects disclosed in the Patent documents 1-3 together, it is obvious that the GaP light extraction layer having the {100} surface on the first main surface thereof cannot be roughened simply by immersing it into the etching solution, so far as any publicly-known etching solution for GaP (hydrochloric acid, sulfuric acid, hydrogen peroxide or mixed solutions of these components, according to paragraph 0026 in the Patent document 1) is used as the etching solution, and that it is difficult to form the irregularities capable of improving the light extraction efficiency to a sufficient degree.

Also, GaP is III-V compound semiconductor having a zincblende structure, and has a crystal structure having closest packing surfaces of Ga and closest packing surfaces of P stacked alternately in the <111> direction. In this case, GaP single crystal having a principal axis orientation adjusted to exact <100> has the equal existence rate of Ga atoms and P atoms on the two main surfaces, however in a case of an off-angled {100} surface, the existence rate becomes unbalanced, so as that it is rich in Ga on the one main surface and rich in P on the other. The present inventors have studied and found that in the case of an off-angled {100} surface, surface roughening by chemical etching is especially difficult on the P-rich side.

The Patent Document 1 discloses a method of etching the {100} main surface of the GaP light extraction layer, after covering it with a finely-patterned resin mask. Although the document also formally suggests wet etching (chemical etching) as the etching method, all specific disclosures including the embodiments are made only on dry etching based on RIE (reactive ion etching). Dry etching costs high, and is disadvantageous in terms of its extremely low process efficiency, because only a small area of substrate can be processed at a time. Also, there is no specific method disclosed for effective surface roughening by chemical etching on a {100} surface off-angled so as to be rich in P.

On the other hand, the Patent Documents 2 and 3 give no specific information on the formation of the irregularities by etching the {100} main surface of the GaP light extraction layer, because the light extraction surface herein is composed of GaAlAs. A method adopted herein is such as forming a macroscopic secondary trench pattern having a triangle section by mechanical processing so as to expose the {111} surface allowing the etching to proceed thereon more easily, and subjecting the surface of the secondary pattern to chemical etching. The method is, however, disadvantageous in that the number of process steps increases corresponding to necessity of the mechanical processing for forming the grooves.

The light emitting device having the GaP light extraction layer can increase the amount of light extractable from the side faces of the GaP light extraction layer, if the layer is thickened. Therefore the light extraction efficiency of the device as a whole can further be increased by roughening also the side faces of thus-thickened GaP light extraction layer. The methods of surface roughening described in the Patent Documents 1-3, however, essentially need process steps of forming the mask and the trenches, which are permissible only on the main surface of the wafer, and this consequently raises a critical disadvantage in that the surface roughening is not adoptable to the side faces of the chip which appear only after the wafer is diced. In particular in the dry etching such as RIE as described in the Patent Document 1, it may be absolutely impossible to etch the side faces by allowing the etching beam, directed straightforward to the main surface of the layer, to come round onto the side faces, due to strong directionality of the etching beam. Further, the methods of surface roughening using epitaxial growth described in the Patent Documents 5 and 6 have a disadvantage that it is difficult to conduct surface roughening producing distinguished irregularities, comparing to methods by etching, and also that surface roughening to side faces of a chip is almost impossible. In these documents, there is no specific method disclosed for effective surface roughening by chemical etching on a {100} surface off-angled so as to be rich in P.

It is therefore a subject of this invention to provide a fabricating method of a light emitting device, allowing surface roughening to be easily applied to a GaP light extraction layer having a {100} surface, off-angled so as to be rich in P, as a main surface.

SUMMARY OF THE INVENTION

Aiming at solving the above-described subject, a method of fabricating a light emitting device according to this invention is such as comprising:

a light emitting device wafer fabricating step of fabricating a light emitting device wafer having a light emitting layer section based on a double heterostructure in which a first-conductivity-type cladding layer, an active layer and an second-conductivity-type cladding layer, each of which being composed of a compound having a composition allowing lattice matching with GaAs, out of compound expressed by formula $(Al_xGa_{1-x})_yIn_{1-y}P$ (where, $0 \leq x \leq 1$, $0 \leq y \leq 1$), are stacked in this order, and a GaP light extraction layer disposed, having a main surface, on a side not faced to the active layer, of the first-conductivity-type cladding layer of the light emitting layer section as a first main surface, so that on the first main surface of the light emitting layer section a {100} surface appears on the first main surface of itself;

a surface roughening step of forming surface roughening projections by etching the first main surface of the GaP light extraction layer, using an etching solution for surface roughening; and a dicing step of dicing the light emitting device wafer to light emitting device chips, wherein on the light emitting device wafer fabricating step, the GaP light extraction layer is formed to have a principal crystal axis thereof off-angled in a degree range of 1° to 25°, both ends inclusive, from <100> direction, so as that a P-rich off-angled {100} surface, having a higher existence rate of P atoms than an exact {100} surface, appears on the first main surface thereof, the etching solution for surface roughening at the surface roughening step contains:

acetic acid (on $CH_3COOH$ basis): 40% by mass or more and 75% by mass or less;

hydrofluoric acid (on HF basis): 2% by mass or more and 8% by mass or less;

nitric acid (on $HNO_3$ basis): 4.5% by mass or more and 16% by mass or less; and iodine (on $I_2$ basis): 0.6% by mass or more and 1.5% by mass or less, and has a water content of 2% by mass or more and 25% by mass or less.

"A compound semiconductor allowing lattice matching with GaAs" in this invention means a compound semiconductor having a ratio of lattice mismatching expressed by $\{|a1-a0|/a0\} \times 100(\%)$ fallen within a 1% range, where a1 is a lattice constant of the compound semiconductor expected for the bulk crystal state having no stress-induced lattice displacement produced therein, and a0 is a lattice constant of GaAs in the same state. "A compound having a composition allowing lattice matching with GaAs, out of compound expressed by formula $(Al_xGa_{1-x})_yIn_{1-y}P$ (where, $0 \leq x' \leq 1$, $0 \leq y' \leq 1$)" will be referred typically to as "AlGaInP lattice-matched to GaAs". The active layer may be configured as a single AlGaInP layer, or as a quantum well layer having barrier layers and well layers, differed in the AlGaInP composition from each other, alternately stacked therein (quantum well layers as a whole is assumed as a single active layer).

According to the above method of this invention, even in a case that the P-rich off-angled {100} surface having a higher existence rate of P atoms than the exact {100} surface the first main surface appears on the first main surface of the GaP light extraction layer, using the etching solution for surface roughening containing acetic acid, hydrofluoric acid, nitric acid and iodine in the above specific composition range allows to proceed irregularities formation prominently with an anisotropic etching principal, and consequently to form surface roughening projections efficiently and inexpensively on the first main surface of the GaP light extraction layer. Also, as mentioned above, in a case that a GaP light extraction layer whose principal axis <100> is added an off-angle, when the above P-rich off-angled {100} surface appears on one of the main surfaces thereof, a Ga-rich off-angled {100} surface, having a higher existence rate of Ga atoms than the exact {100} surface, appears on the other main surface. Hereinafter, for sake of simplicity, regarding III-V compound semiconductor single crystal having a <100> principal crystal axis given an off-angle, an off-angled {100} surface rich in a III group element is referred as a $\{100\}_A$ surface, and an off-angled {100} surface rich in a V group element (P) is referred as a $\{100\}_B$ surface. Also, regarding main surfaces of the substrate or each layer, a $\{100\}_B$ surface side is a first main surface thereof.

In order to enable formation of the surface roughening projections by chemical etching on the surface of a compound semiconductor single crystal having no crystal boundary, it is necessary for the etching solution employed herein to exhibit larger etchrate on a crystal surface having a specific orientation than on crystal surfaces having other orientations (the surface advantageous for the etching will be referred to as "predominantly-etchable surface", hereinafter), that is, to enable anisotropic etching dependent on surface orientation. Crystal surface obtained after allowing anisotropic etching to proceed thereon shows a combination of several predominantly-etchable surfaces differed in the surface index but equivalent in terms of crystallography, and therefore produces irregularity ascribable to the geometry specific to the crystal structure. GaP based on the cubic system has the surfaces which belong to the {111} group showing the closest packing as the predominantly-etchable surface. Assuming that also the surface having the inverse sign as the identical surfaces, the {111} group is now understood as including four surfaces differed in the orientation, so that the surface roughening based on anisotropic etching tends to produce pyramid-like irregularities based on combination of these surfaces.

The first main surface of the GaP light extraction layer adopted in this invention appears as the $\{100\}_B$ surface largely inclined from the predominantly-etchable {111} surface, and can allow the formation of irregularities to distinctively proceed thereon, if the predominantly-etchable surface can selectively be exposed in the initial stage of the etching. The etching solution for surface roughening adopted in this invention not only shows a large etchrate to a certain degree on the $\{100\}_B$ surface of GaP, but also shows an etchrate on the {111} surface appropriately differed therefrom, and consequently has a large effect of forming the irregularities while allowing the {111} surface to selectively expose.

The above surface roughening etching solution having any component of acetic acid, hydrofluoric acid, nitric acid, iodine and water out of the above-defined ranges results in insufficient effect of anisotropic etching on the above $\{100\}_B$ surface of GaP single crystal, and thereby results in only insufficient formation of the surface roughening projections on the first main surface of the GaP light extraction layer on where the $\{100\}_B$ surface appears. The rest subtracted the total of acetic acid, hydrofluoric acid, nitric acid, iodine and water from 100% by mass may be accounted for by other components (such as carboxylic acid or the like, other than acetic acid) within a range which does not damage the effect of anisotropic etching to GaP on the $\{100\}_B$ surface. The surface roughening etching solution more preferably adoptable is such as containing:

acetic acid (on $CH_3COOH$ basis): 60% by mass or more and 75% by mass or less;
hydrofluoric acid (on HF basis): 4% by mass or more and 5.5% by mass or less;
nitric acid (on $HNO_3$ basis): 10% by mass or more and 16% by mass or less; and
iodine (on $I_2$ basis): 1% by mass or more and 1.5% by mass or less,
and has a water content of 2% by mass or more and 15% by mass or less. In other words, in view of raising the anisotropic etching effect on the $\{100\}_B$ surface of GaP single crystal, it can be important to suppress the water content to a low level as described in the above, and to allow acetic acid, rather than water, to function as a main acidic solvent.

From a viewpoint of increasing the effect of anisotropic etching so as to form the surface roughening projections more prominently, it is more preferable to set a mass composition ratio of (acetic acid/(hydrofluoric acid+nitric acid)) of the surface roughening etching solution to 2 to 10, both ends inclusive.

Regarding the above method of this invention, having a {100} surface appearing on the first main surface of the GaP light extraction layer is one desirable consequence on the process, in a case of forming both the first-conductivity-type cladding layer and the GaP light extraction layer as n-type semiconductor layers. It is because of the following reasons. First, a light emitting layer section composed of AlGaInP can be formed by epitaxial growth onto a GaAs substrate. For the case where the AlGaInP light emitting layer section is grown by the MOVPE method, provision of an appropriate off-angle to the GaAs substrate can considerably reduce ordering and maldistribution of the Group III elements, and can yield the light emitting device having a uniform emission spectral profile and center wavelength among chips. It is easier to fabricate n-type GaAs single crystal than p-type one, and therefore in a case of epitaxially growing an AlGaInP light emitting layer section having <100> as the principal crystal axis, a n-type GaAs single crystal substrate whose principal crystal axis is <100> with an off-angle added is used. Here, the GaAs single crystal substrate is n-type, so that an n-type cladding layer, an active layer and a p-type cladding layer of the light emitting section are grown in this order from the substrate side.

On the other hand, when an n-type cladding layer or a p-type cladding layer is grown, it's known that addition-efficiency and uniformity of dopant are excellent in a case of conducting epitaxial growth using a {100} main surface, where is especially Ga-rich side, of the off-angled n-type GaAs single crystal substrate, that is a $\{100\}_A$ surface side. Accordingly, when the light emitting layer section is epitaxially grown from the n-type cladding layer side on the $\{100\}_A$ surface of the n-type GaAs single crystal substrate, the obtained light emitting layer section having the $\{100\}_A$ surface appearing on the main surface of the p-type cladding layer side and the $\{100\}_B$ surface appearing on the main surface of the n-type cladding layer side.

Next, for the case where the GaP light extraction layer is formed on the AlGaInP light emitting layer section, when the light emitting layer section is epitaxially grown on the off-angled GaAs substrate, as mentioned above, the crystal orientation of the GaP light extraction layer needs to be agreed with the off-angled light emitting layer section. It is because disagreement of the crystal orientation between the light emitting layer section and the GaP light extraction layer may impair ohmic contact between both layers, and may undesirably increase the forward voltage of the light emitting device or the like. The GaP light extraction layer formed by the vapor phase growth process inevitably has the crystal orientation agreed with the crystal orientation of the light emitting layer section, whereas for the case where the layer is formed by bonding the single crystal substrate, also the single crystal substrate used herein needs to be added with the same off-angle in the same direction as the light emitting layer section.

In a case that the $\{100\}_B$ surface appears on a first main surface of the GaP light extraction layer, the $\{100\}_B$ surface has to also appear on the first main surface of the light emitting layer section where the GaP light extraction layer formed. Whereas, the main surface appearing as the $\{100\}_B$ surface of the light emitting layer portion is the main surface of the n-type cladding layer side as mentioned above. Accordingly, the GaP light extraction layer as well as the first-conductivity-type cladding layer on where it is formed has n-type conductivity. Needless to say, the first main surface of the light emitting layer section appearing as the $\{100\}_B$ surface has the GaAs single crystal substrate appertaining just after growth of the light emitting layer section, and therefore the GaP light-extraction layer is formed after removing the GaAs single crystal substrate.

In order to improve homogeneity of the light emitting layer section of the light emitting device wafer, it is preferable to have a degree range of the off-angle of 10° to 25°, both ends inclusive, that is a high angle side of the above off-angle. As described above, when a degree of the off-angle increases, the $\{100\}_B$ surface appearing on the first main surface of the GaP light extraction layer has a even higher existence rate of P atoms, so as to be a disadvantageous in view of forming surface roughening projections by chemical etching. However, using the etching solution for surface roughening of this invention allows to form surface roughening projections well even on the above-described-highly off-angled $\{100\}_B$ surface of the first main surface of the GaP light extraction layer.

Next, etching for surface roughening used for this invention described above is excellent in an anisotropic etching effect of the $\{100\}_B$ surface of the GaP light extraction layer, and has a relatively suppressed content rate of hydrofluoric acid, so as to has a characteristic of small corrosivity to electrode metal mainly composed of Au. Therefore, a light emitting device wafer fabricating step includes a light-extraction-side electrode forming step of covering a part of the first main surface of the GaP light extraction layer with a light-extraction-side electrode mainly composed of Au (80% by mass or more) having an area not covered with the light-extraction-side electrode of the first main surface as a main light extraction area, on the surface roughening step, the surface roughening projections are formed on the main light extraction area by contacting the main light extraction area as well as the light-extraction-side electrode with the etching solution for surface roughening. By this step, after forming the light-extraction-side electrode, without masking the light-extraction-side electrode by etching resist, surface roughening can be applied to the main light extraction area of the GaP light extraction layer without excessive corrosion of the electrode, so as to be able to simplify the steps greatly. In addition, in order to maintain the anisotropic etching effect as well as to suppress corrosivity against electrode metal mainly composed with Au, it is preferable to set a mass composition ratio of (hydrofluoric acid/acetic acid) to 0.03 to 0.13, both ends inclusive.

Also, using this etching for surface roughening mentioned above allows to form surface roughing projections easily on side-face light extraction areas of the GaP light extraction layer composed of chip side faces formed by dicing. Being capable of forming surface roughening projections on the GaP light extraction layer with an anisotropic etching effect by simply immersing in the etching solution means being capable of forming surface roughening projections easily on the side faces of the GaP light extraction layer, on which mask-forming and groove-forming are conventionally impossible as described in the Patent Documents 1 and 2. Especially, in a case of forming the GaP light extraction layer having thickness of 10 μm or more, forming surface roughening projections on the side faces thereof allows to increase a light extraction efficiency of the device greatly, together with increase of the side-face areas by increase of the thickness of the GaP light extraction layer. These are effects which never be able to be reached with the techniques disclosed in the Patent Documents 1 and 2. Additionally, in order to increase the light extraction efficiency form the side faces of the GaP light extraction layer, the GaP light extraction layer having thickness of 40 μm or more (the upper limit is, for example, 200 μm or less) is preferred.

In this case, by conducting the surface roughening step after the dicing step and allowing the first main surface as well as the side faces of the GaP light extraction layer to contact with the surface roughening etching solution, surface roughening projections on the side faces are formed, allowing the surface roughening step of the first main surface and the side faces to be conducted all at once, so as to contribute to further simplification of the steps.

It's been considered that if the orientation of the side-face areas of the GaP light extraction layer is agreed with the $\{110\}$ surface, which is a cleavage plane of GaP single crystal, combination of half-dicing of the wafer and breaking based on cleavage can simplify the separation process for producing the chips, and can also contribute to improvement in the production yield of the light emitting device, because nonconformities such as cracking in undesired directions and chipping of the chips are less likely to occur. Even in the process of full-dicing of the wafer for separation into chips, agreement of the dicing plane with the cleavage plane can improve the production yield, because the load of the dicing can be suppressed to a low level, wherein also the chipping is less likely to occur. Aiming at full exhibition of the above-described advantages, it has been a fixed idea for III-V compound semiconductor devices having the zincblende structure, but not limited to the light emitting device within a scope of this invention, to adjust the direction of dicing to the <110> direction when they are manufactured by dicing wafers having the $\{100\}$ main surface (also simply referred to as $\{100\}$ wafer, hereinafter). For example, the Patent Document 4 discloses a method of fabricating a light emitting device, involving dicing of a wafer having the main surface appearing as the $\{100\}$ surface in parallel with the orientation flat, wherein the orientation flat of the wafer is generally formed in parallel with the $\{110\}$ surface, so that the dicing direction described in the Patent Document 4 is in the <110> direction.

The surface roughening projections formed by the anisotropic etching are, however, formed as having a basic form of regular octahedron surrounded by the $\{111\}$ surfaces, and shows on the $\{110\}$ surface, as shown in FIG. 6, a flattened geometry such that the regular octahedron is vertically split by a plane containing the axial line, proving intrinsic difficulty in forming deeply-profiled irregularities by anisotropic etching. Crystal defects such as dislocation caused by mechanical processing are likely to distribute along the cleavage plane, so that the surfaces exposed by the cleavage and/or dicing tend to have a relatively large density of residual dislocations or the like, and this further retards the chemical etching. For this reason, it is inevitable in some cases that the thoroughness of formation of the surface roughening projection on the side-face light extraction areas composed of the {110} surface is substantially moderated. Another problem resides in that the AlGaInP light emitting layer section and the GaP light extraction layer tend to produce therebetween mismatch-induced stress due to difference in the lattice constants, so that dicing along the {110} surface, which is a cleavage plane, is likely to cause laminar cracks along the cleavage plane (and consequently the chip edge) under mismatch-inducing stress, and may even result in failures such as chipping of the chip edge or the like.

It is found out that all of the above-described nonconformities can be completely resolved if the light emitting device, having the GaP light extraction layer formed on the AlGaInP light emitting layer section, is manufacture by dicing while allowing the {100} surface to appear on the side faces thereof, as shown in FIG. 4. In other words, by avoiding agreement between the dicing surface and the cleavage plane, any cleaving cracks even if accidentally produced will appear in the direction crossing the chip edge as shown in the lower part of FIG. 4, and thereby the failures ascribable to chipping and the like can largely be suppressed. Thus-obtained light emitting device in this case is configured as having the side-face areas of the GaP light extraction layer, composed of the {100} surface of GaP single crystal.

When the side face composed of the {100} surface is further subjected to anisotropic etching using the above-described etching solution for surface roughening, geometry of the surface roughening projections formed in the side-face light extraction areas shows a pyramid-like form as shown in FIG. 5, similarly to as obtained in the main light extraction area, allowing formation of far deeper-profiled irregularities as compared with the embodiment shown in FIG. 6 where the {110} surfaces appear on the side faces, and this raises an additional advantage of considerably improving the light extraction efficiency from the side faces.

Also, because the GaP light extraction layer is added an off-angle, a plurality of the {100} surfaces composed of side faces thereof also become partly Ga-rich $\{100\}_A$ surfaces, and some of the rest become P-rich $\{100\}_B$ surfaces (for example, a chip having a square shape has an adjacent pair of the side faces appearing as the $\{100\}_A$ surfaces, and the rest of the adjacent pair of the side faces appearing as the $\{100\}_B$ surfaces). However the surface roughening etching solution of this invention allows to conduct surface roughening without problems, despite that the existence rate of P atoms differs depending on the surfaces.

BEST MODES FOR CARRYING OUT THE INVENTION

Paragraphs below will describe embodiments of this invention referring to the attached drawings.

Figure 1:
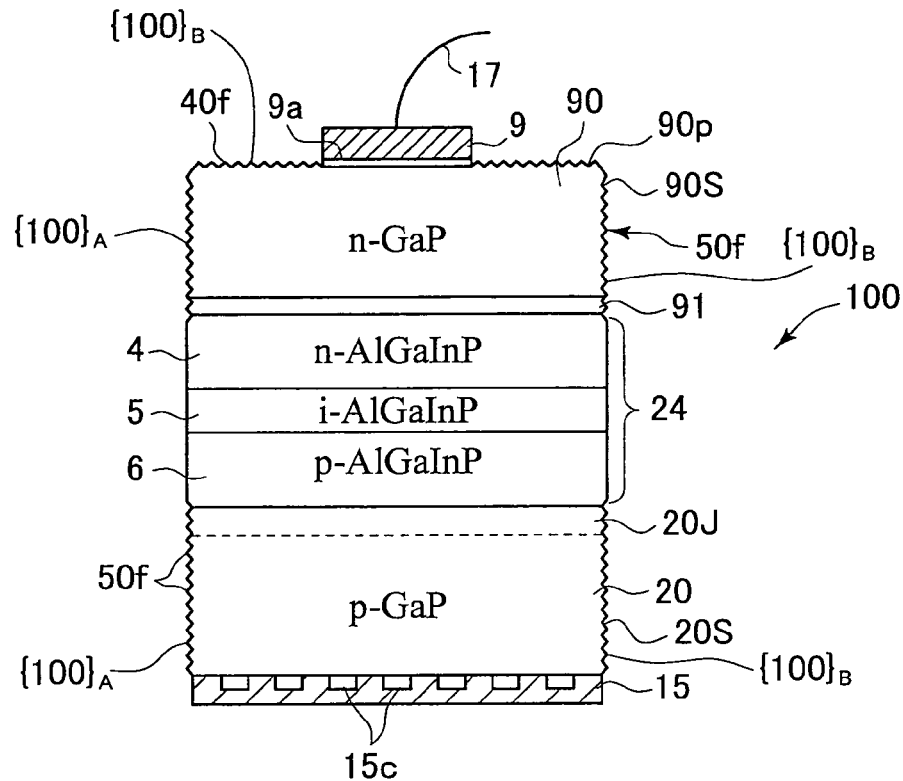
FIG. 1 is a schematic drawing showing a sectional side elevation of an exemplary light emitting device subject to this invention.

FIG. 1 is a conceptual drawing of a light emitting device 100 as one embodiment of this invention. The light emitting device 100 has a light emitting layer section 24 composed of a III-V compound semiconductor, and an n-type GaP light extraction layer 90 formed on a first main surface side of the light emitting layer section 24. On a second main surface side of the light emitting layer section 24, a p-type GaP base layer 20 is disposed. In this embodiment, a chip of the light emitting device 100 has a plain geometry of 300 μm square (referred to FIG. 2).

The light emitting layer section 24 has a structure in which an active layer 5 composed of a non-doped $(Al_xGa_{1-x})_yIn_{1-y}P$ alloy (where, $0 \leq x \leq 0.55$, $0.45 \leq y \leq 0.55$) is held between an n-type cladding layer (first-conductivity-type cladding layer) 4 composed of an n-type $(Al_zGa_{1-z})_yIn_{1-y}P$ alloy (where, $x<z \leq 1$), and a p-type cladding layer (second-conductivity-type cladding layer) 6 composed of a p-type $(Al_zGa_{1-z})_yIn_{1-y}P$ alloy (where, $x<z \leq 1$). The light emitting device 100 shown in FIG. 1 has the n-type cladding layer 4 disposed on the first main surface side (upper side in the drawing), and has the p-type cladding layer 6 disposed on the second main surface side (lower side in the drawing). It is to be noted that "non-doped" in the context herein means "not intentionally added with a dopant", and never excludes possibility of any dopant components inevitably included in the normal fabrication process (up to $1 \times 10^{13}$ to $1 \times 10^{16}/cm^3$ or around, for example). The light emitting layer section 24 is grown by the MOVPE method. Thickness of each of the n-type cladding layer 4 and the p-type cladding layer 6 is typically 0.8 μm to 4 μm (more preferably 0.8 μm to 2 μm), both ends inclusive, and thickness of the active layer 5 is typically 0.4 μm to 2 μm (more preferably 0.4 μm to 1 μm), both ends inclusive. Total thickness of the light emitting layer section 24 as a whole is typically 2 μm to 10 μm (more preferably 2 μm to 5 μm), both ends inclusive.

Figure 2:
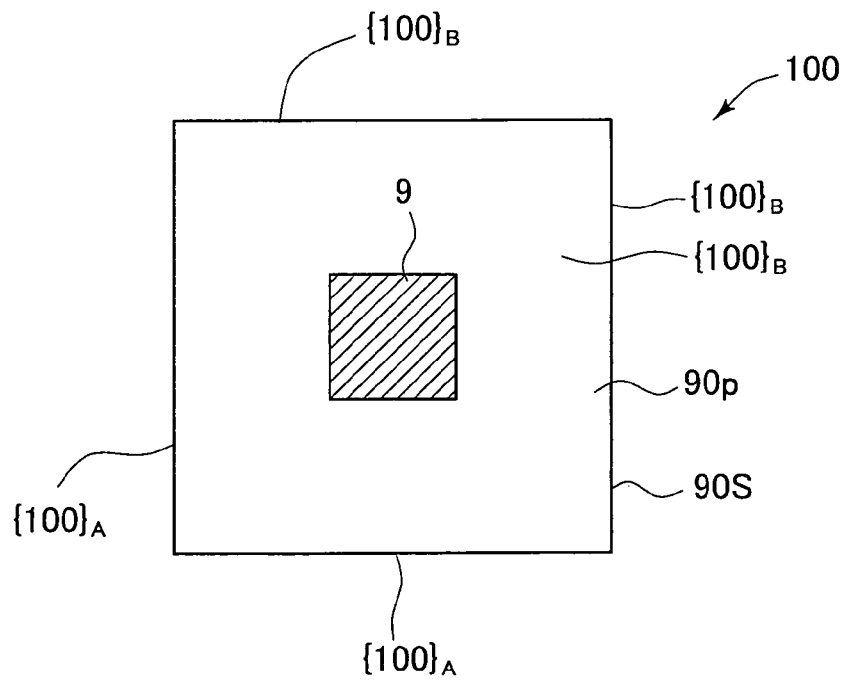
FIG. 2 is a schematic plan view of the same.

The n-type GaP light extraction layer 90 is formed to as thick as 10 μm to 200 μm (more preferably 40 μm to 200 μm: typically 100 μm in this embodiment), both ends inclusive, and as shown in FIG. 2, a light-extraction-area-side electrode 9 is formed so as to cover a part (center portion herein) of the first main surface thereof. The light-extraction-area-side electrode 9 is composed of mainly Au and connected with one end of an electrode wire 17. The peripheral area around the light-extraction-area-side electrode 9 forms a main light extraction area 90p. The side faces of the n-type GaP light extraction layer 90 form side-face light extraction areas 90S. The n-type GaP light extraction layer 90 formed to as thick as described in the above allows emission drive current, based on current supply through the light-extraction-side electrode 9, to spread in-plane over the device, to thereby function as a current spreading layer assisting in-plane uniform emission of the light emitting layer section 24, and also takes part in increasing beam of light extractable from the side faces of the layer, to thereby function as raising the luminance of the device as a whole (luminance measured in an integrating sphere). GaP has a band gap energy larger than that of AlGaInP composing the active layer 5, and is desirably suppressed in absorption of the emission beam.

The n-type GaP light extraction layer 90 is formed by bonding an n-type GaP single crystal substrate (however an epitaxially-grown layer obtained by the HVPE method also allowable: reference numeral 91 represents a connection layer composed of AlGaInP). The crystal orientation of the n-type GaP light extraction layer 90 is agreed with that of the light emitting layer section 24 (that is, degrees of the off-angle coincide).

The p-type GaP base layer 20 is grown by the HVPE method (MOVPE method and bonding the p-type single crystal substrate are also allowable) and the entire second main surface is covered with back electrode 15 composed of Au electrode or the like. Additionally, the crystal orientation of the p-type GaP base layer 20 agrees with the light emitting layer section 24 (that is, the degrees of the off-angles are agreed). Between the p-type GaP base layer 20 and the light emitting layer section 24, a connection layer 20J composed of a GaP layer is formed, as being continued from the light emitting layer section 24 by the MOVPE method. The connection layer 20J herein may be composed of an AlGaInP layer capable of gradually changing difference in the lattice constants (and consequently alloy composition) between the light emitting layer section 24 composed of AlGaInP and the p-type GaP base layer 20. Thickness of the p-type GaP base layer 20 is typically 10 μm to 200 μm, both ends inclusive.

The back electrode 15 also functions as a reflective layer for the beam of light coming from the light emitting layer section 24 through the p-type GaP base layer 20, and contributes to improvement in the light extraction efficiency. Between the back electrode 15 and the p-type GaP base layer 20, an alloyed contact layer 15c composed of an AuBe alloy or the like, for reducing contact resistance between the both, is formed as being distributed according to a dot pattern. The alloyed contact layer 15c slightly lowers its reflectivity as alloying with a compound semiconductor layer composing the p-type GaP base layer 20 proceeds, so that the layer is formed as being distributed according to a dot pattern, so as to allow the background area to function as a direct reflection surface composed of a high-reflectivity back electrode 15. On the other hand, an alloyed contact layer 9a composed of an AuGeNi alloy or the like is formed between the light-extraction-side electrode 9 and the n-type GaP light extraction layer 90.

Figure 3:
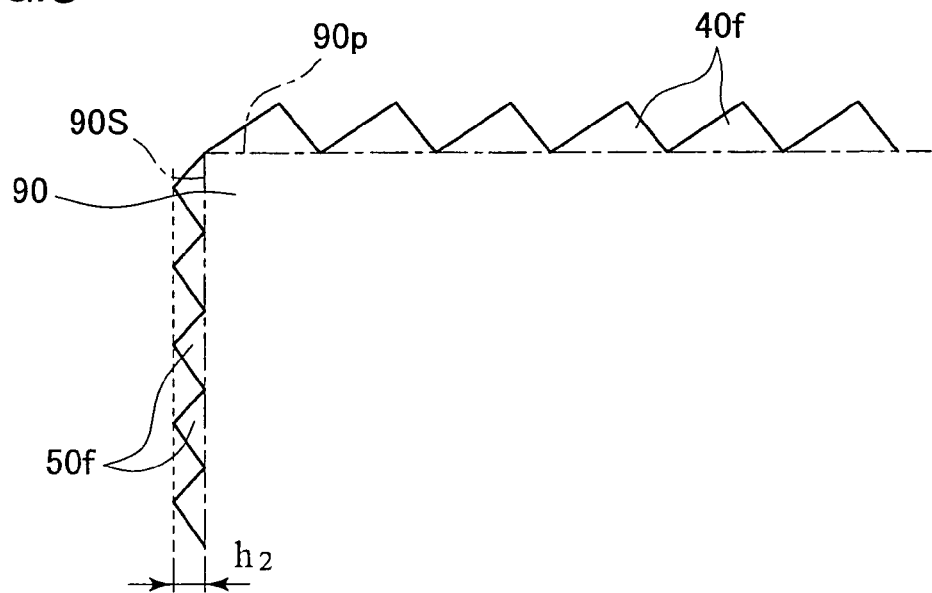
FIG. 3 is a conceptual drawing of the surface roughening projections formed on the GaP light extraction layer shown in FIG. 1.

The n-type GaP light extraction layer 90 has, as shown in FIG. 3, surface roughening projections 40f, 50f formed by chemical etching on the main light extraction area 90p and on the side-face light extraction areas 90S, respectively. The outer surfaces of projection composing the surface roughening projections 40f, 50f are formed by chemical anisotropic etching of GaP single crystal, as being mainly composed of the {111} surfaces (50% or more of the total surface of the projections). The main light extraction area (first main surface) 90p of the n-type GaP light extraction layer 90 has a base plane obtained by leveling the irregularities as the $\{100\}_B$ surface (P-rich off-angled {100} surface: off-angle of 1° to 25°, and 15° in this embodiment), and the surface roughening projections 40f are formed by bringing the flat {100} principal crystal surface into contact with an etching solution for surface roughening described later so as to proceed anisotropic etching. Also the side-face light extraction areas 90S have the adjacent pair of the base plane obtained by leveling the irregularities appearing as the $\{100\}_B$ surface, and the adjacent pair of the rest appearing as the $\{100\}_A$ surface, and the surface roughening projections 50f are formed similarly by anisotropic etching. By forming the surface roughening projections 40f, 50f, the light emitting device 100 is largely improved in the light extraction efficiency. Side-face light extraction areas 20S of the p-type GaP base layer 20 have the adjacent pair of the base plane obtained by leveling the irregularities appearing as the $\{100\}_B$ surface, and the adjacent pair of the rest appearing as the $\{100\}_A$ surface, and the surface roughening projections 50f are formed similarly by anisotropic etching.

Figure 7:
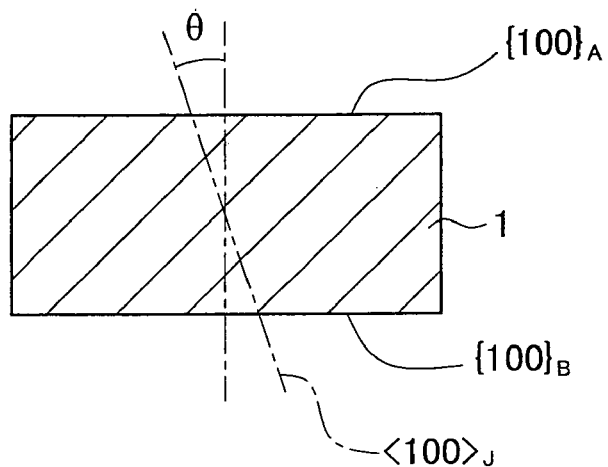
FIG. 7 is a drawing explaining process steps of fabricating the light emitting device shown in FIG. 1.
Figure 7:
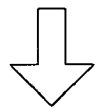
Figure 7:
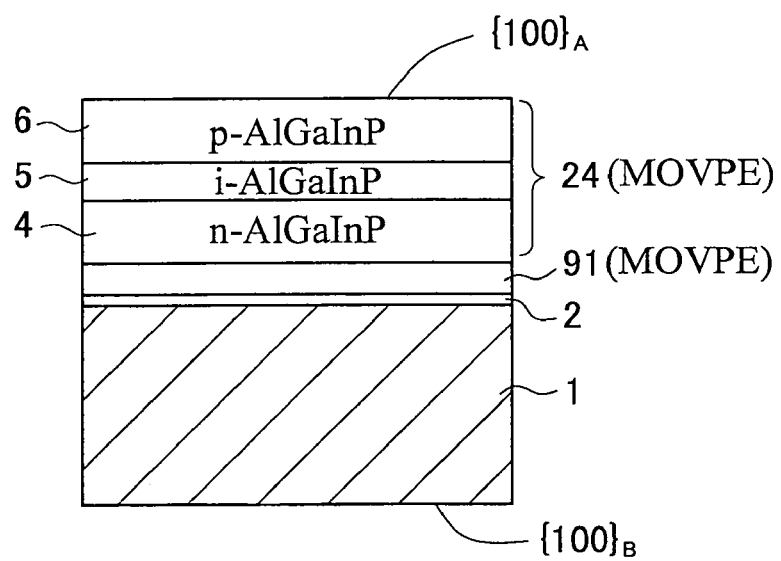

Paragraphs below will describe a method of fabricating the light emitting device 100 shown in FIG. 1. First as shown in STEP 1 of FIG. 7, supposed an exact <100> direction as $<100>_J$, an n-type GaAs single crystal substrate 1, having a principal crystal axis provided with an off-angle θ of 1° to 25° to the $<100>_J$, both ends inclusive, (15° in this embodiment) is obtained as a growth substrate. Next, as shown in STEP 2, an n-type GaAs buffer layer 2 is epitaxially grown on the second main surface of the substrate 1, and further thereon, as the light emitting layer section 24, the n-type cladding layer 4 (n-type dopant is Si) the active layer (non-doped) 5, and the p-type cladding layer 6 (p-type dopant is Mg: also C derived from organo-metallic molecules can be contributive as the p-type dopant), respectively composed of an $(Al_xGa_{1-x})_y In_{1-y}P$ alloy are epitaxially grown in this order. The $\{100\}_A$ surface appears on the second main surface of the p-type cladding layer 6 (upper side of the figure). Further on the p-type cladding layer 6, the connection layer 20J composed of p-type GaP is epitaxially grown as shown in STEP 3 of FIG. 8.

The above-described individual layers are epitaxially grown by any publicly-known MOVPE method. Source gases available as sources of the individual components Al, Ga, In (indium) and P (phosphorus) include the followings:

Al source gas: trimethyl aluminum (TMAl), triethyl aluminum (TEAl), etc.;

Ga source gas: trimethyl gallium (TMGa), triethyl gallium (TEGa), etc.;

In source gas: trimethyl indium (TMIn), triethyl indium (TEIn), etc.; and source gas: trimethyl phosphorus (TMP), triethyl phosphorus (TEP), phosphine ($PH_3$), etc.

Figure 8:
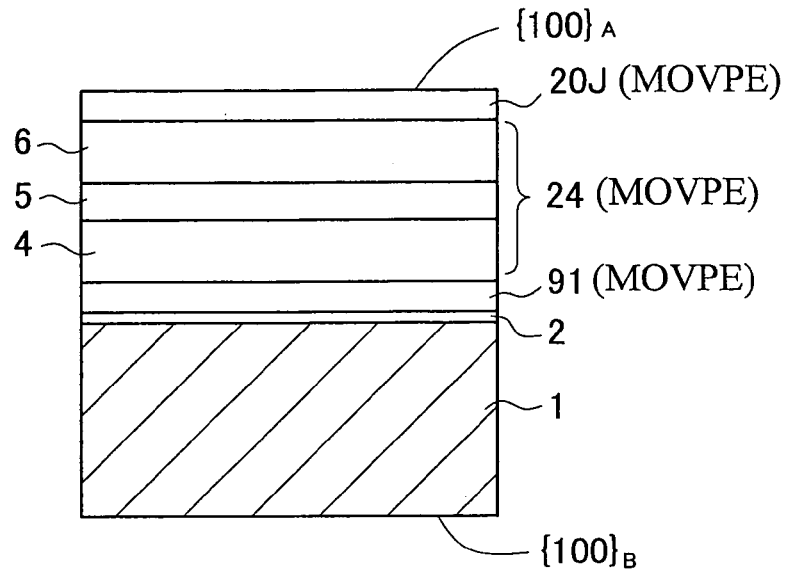
FIG. 8 is a drawing explaining process steps as continued from FIG. 7.
Figure 8:
Figure 8:
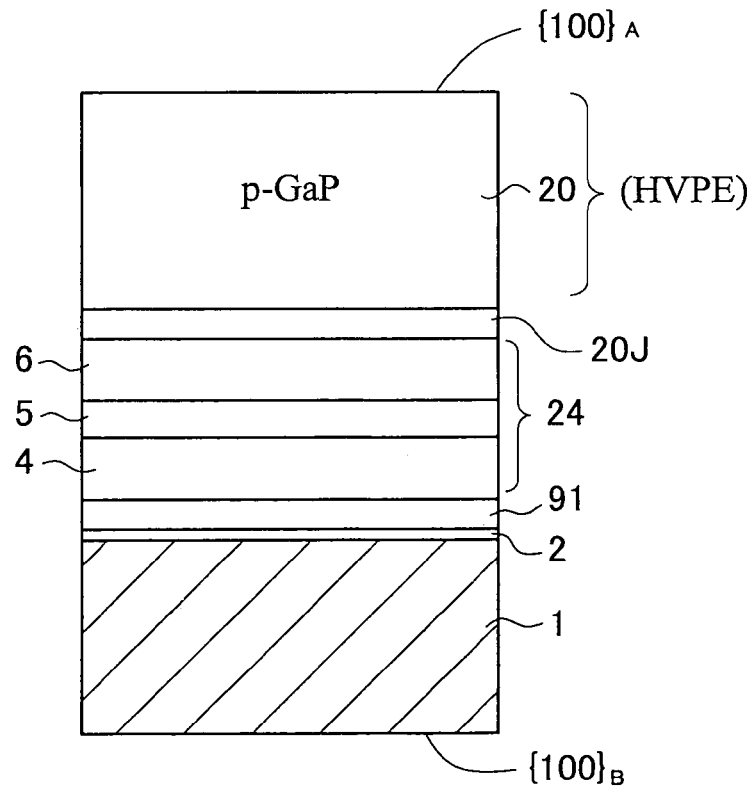

The process then advances to STEP 4 in FIG. 8, wherein a p-type GaP base layer 20 is grown by the HVPE method. The $\{100\}_A$ surface appears on the second main surface of the obtained p-type GaP base layer 20. The HVPE method is specifically proceeded so that Ga as a Group III element is heated and kept at a predetermined temperature in a vessel, and hydrogen chloride is introduced over Ga to thereby produce GaCl through a reaction expressed by the formula (1) below, and is then supplied over the substrate together with $H_2$ gas as a carrier gas:

$$Ga(l) + HCl(g) \rightarrow GaCl(g) + \frac{1}{2}H_2(g) \qquad (1)$$

The growth temperature is typically set to 640° C. to 860° C., both ends inclusive, wherein P as a Group V element is supplied on the substrate in a form of $PH_3$, together with $H_2$ as a carrier gas. Zn as a p-type dopant is supplied in a form of DMZn (dimethyl Zn). GaCl is excellent in reactivity with PH$_3$, and can efficiently grow the p-type GaP base layer 20 according to the reaction expressed by the formula (2) below:

$$GaCl(g)+PH_3(g)\rightarrow GaP(s)+HCl(g)+H_2(g) \qquad (2)$$

Figure 9:
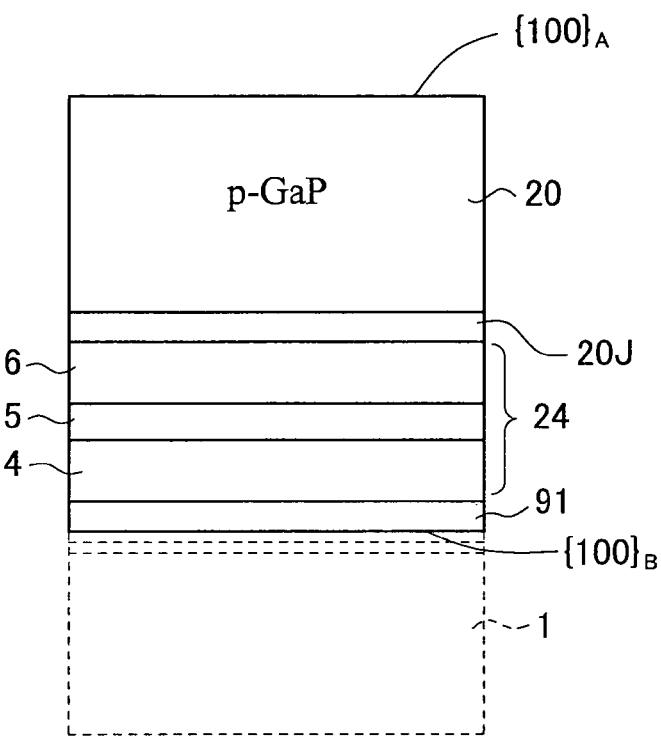
FIG. 9 is a drawing explaining process steps as continued from FIG. 8.
Figure 9:
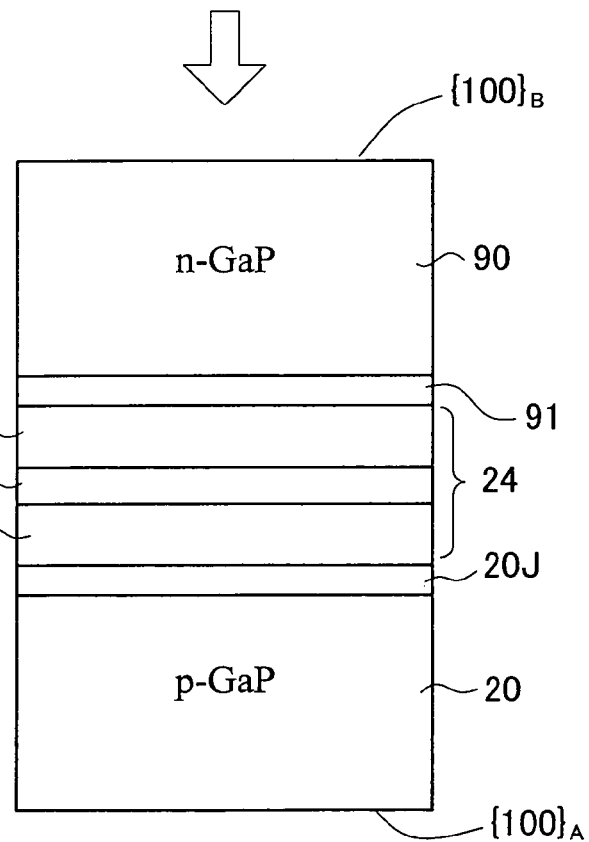

After completion of the growth of the p-type GaP base layer 20, the process advances to STEP 5 in FIG. 9, wherein the GaAs substrate 1 is removed by chemical etching using an etching solution such as an ammonia/hydrogen peroxide mixed solution. On the first main surface side of the light emitting layer section 24, that is a first main surface of a connection layer 91 ({100}$_B$ surface), from which the GaAs substrate 1 has already been removed, a separately-obtained, n-type GaP single crystal substrate is bonded to thereby obtain the n-type GaP light extraction layer 90. As shown in STEP 6, the n-type GaP single crystal substrate has the degree of the off-angle adjusted to the light emitting layer section 24 (GaAs substrate 1), and bonded on the second main surface side thereof appearing as the {100}$_A$ surface, to the first main surface of the connection layer 91 ({100}$_B$ surface).

Figure 10:
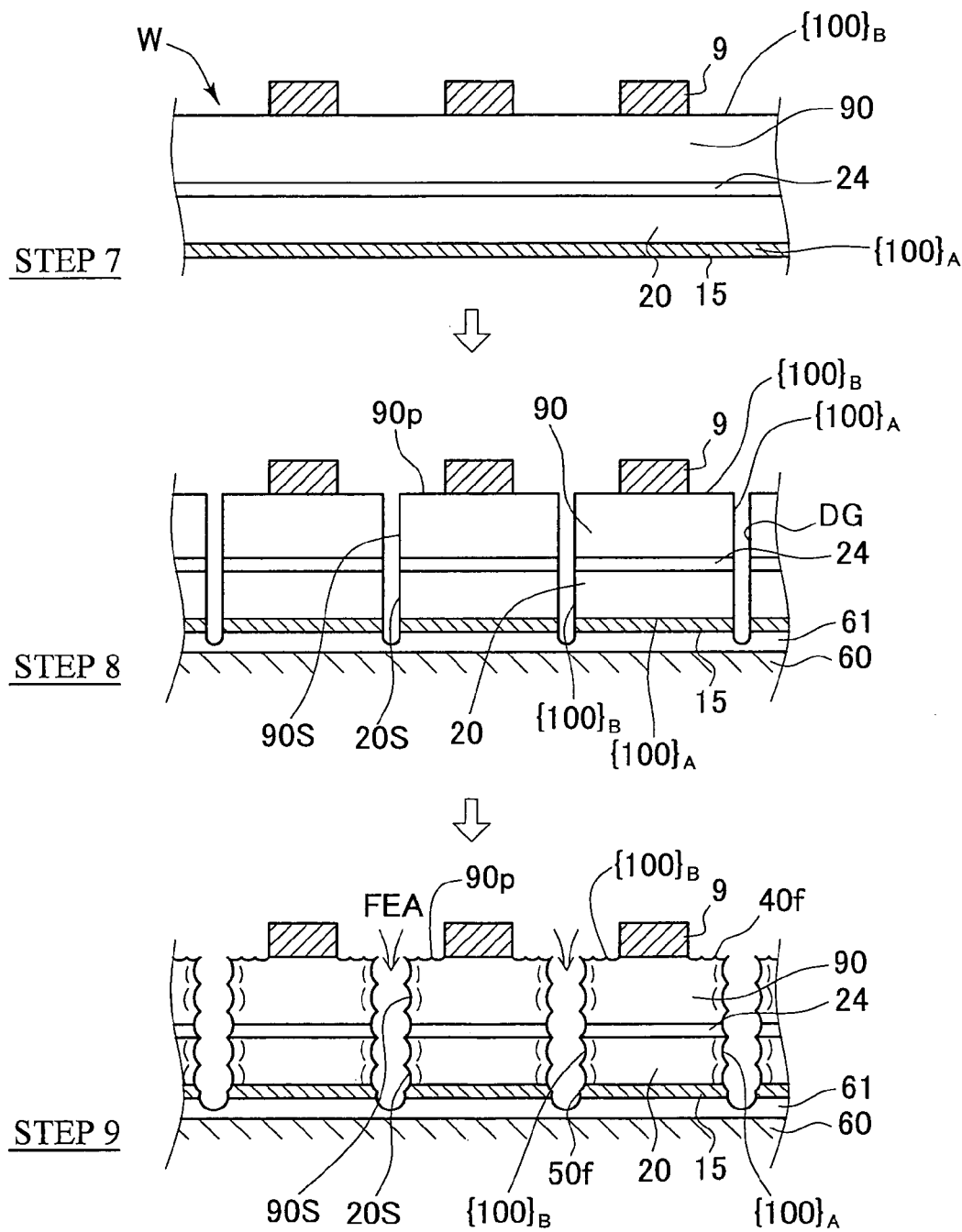
FIG. 10 is a drawing explaining process steps as continued from FIG. 9.

After completion of the above-described process steps, metal layers for forming the alloyed contact layers are formed respectively on the first main surface of the n-type GaP light extraction layer 90 ({100}$_B$ surface) and on the second main surface of the p-type GaP base layer 20 ({100}$_A$ surface) by a sputtering or a vacuum evaporation method as shown in STEP 7 of FIG. 10, and then annealed for alloying (so-called sintering) so as to form the alloyed contact layers 9a, 15c (see FIG. 1, not shown in FIG. 10). The light-extraction-side electrode 9 and the back electrode 15 are formed so as to cover the alloyed contact layers 9a and 15c, respectively, to thereby obtain a light emitting device wafer W.

Figure 4:
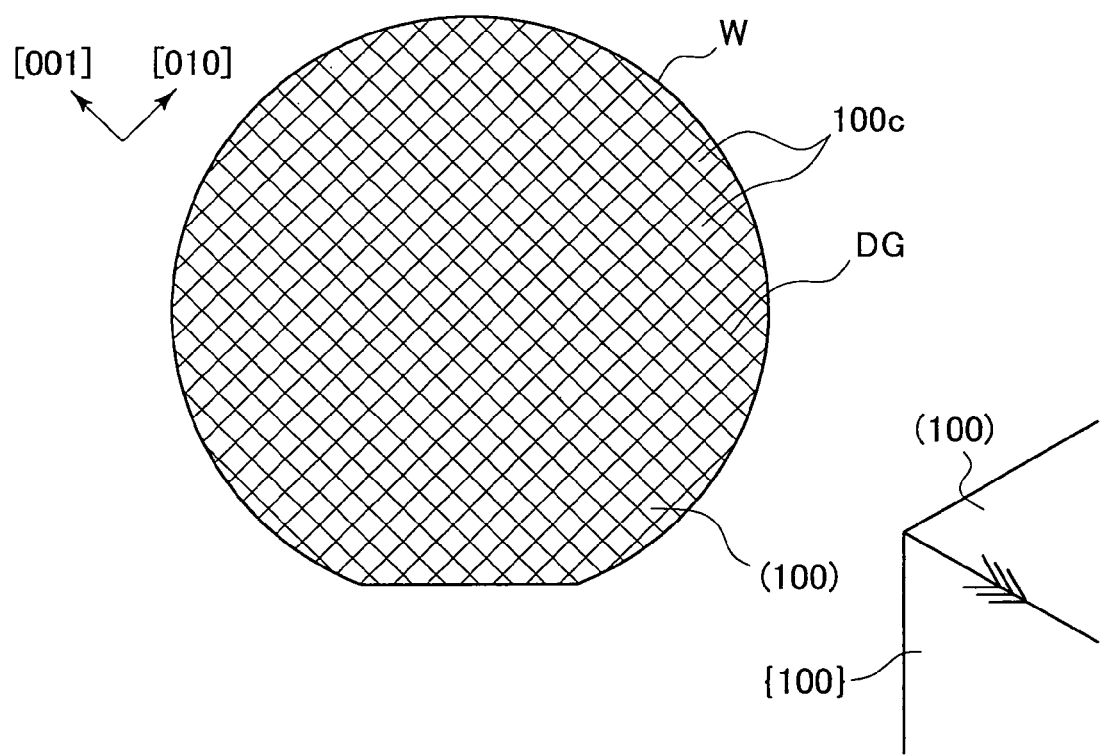
FIG. 4 is a drawing showing an exemplary setting of direction of dicing for fabricating the light emitting device shown in FIG. 1, together with an effect thereof.
Figure 5:
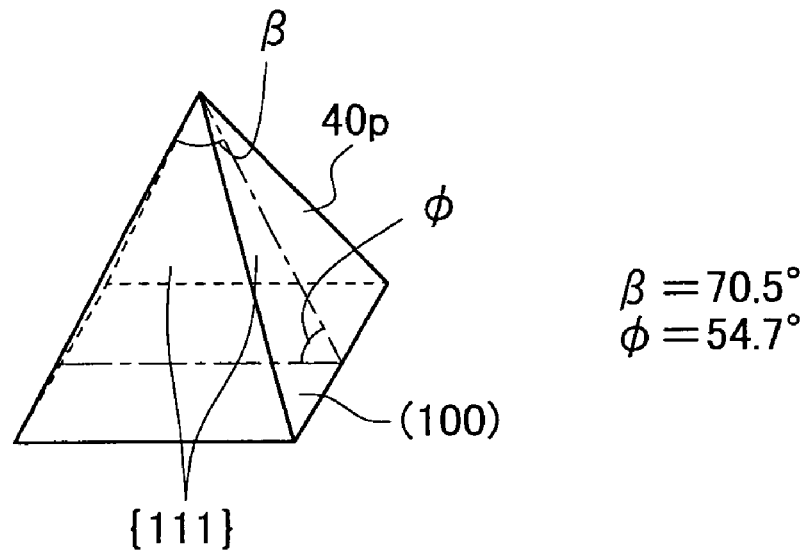
FIG. 5 is a conceptual drawing of a basic geometry of the surface roughening projection formed on the {100} base surface by anisotropic etching.
Figure 6:
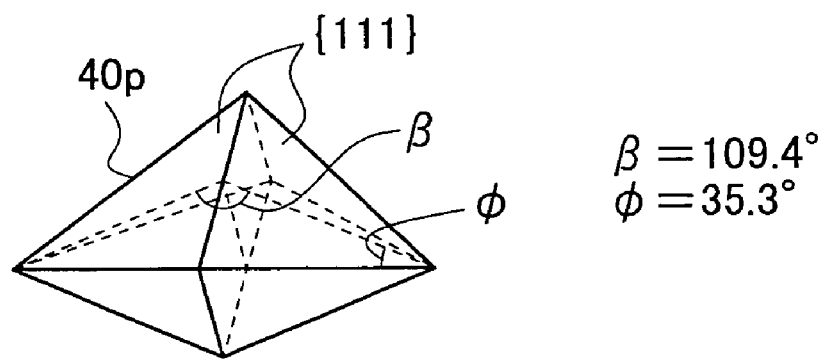
FIG. 6 is a conceptual drawing of a basic geometry of the surface roughening projection formed on the {110} base surface by anisotropic etching.

Next, as shown in STEP 8 (also referred to FIG. 4), the wafer W is then diced in two <100> directions from the first main surface side thereof, using a dicing blade so as to form grooves DG for individualizing the chips. The direction of dicing agreed with the <100> direction makes cracking or chipping along the edges of the chip area less likely to occur. In this embodiment, the wafer W is bonded to a base 60 while placing an adhesive sheet 61 in between, and fully diced in depth.

As shown in STEP 9, the above wafer W after fully diced is immersed in an etching solution FEA for surface roughening without covering the light-extraction-side electrode 9 with etching resist. This allows to conduct anisotropic etching concurrently on both the light extraction area 90p around the light-extraction-side electrode 9 (the first main surface of the n-type GaP light extraction layer 90: the {100}$_B$ surface) and the side-face light extraction areas 90S and the side faces 20S of the p-type GaP base layer 20 formed by dicing (both appears partly as the {100}$_B$ surface, and the rest appears as the {100}$_A$ surface) so as that the surface roughening projections 40f, 50f are formed at once.

The etching solution for surface roughening is an aqueous solution containing acetic acid, hydrofluoric acid, nitric acid and iodine, and specifically contains:
    acetic acid (on CH$_3$COOH basis): 40% by mass or more and 75% by mass or less;
    hydrofluoric acid (on HF basis): 2% by mass or more and 8% by mass or less;
    nitric acid (on HNO$_3$ basis): 4.5% by mass or more and 16% by mass or less; and
    iodine (on I$_2$ basis): 0.6% by mass or more and 1.5% by mass or less,
and has a water content of 2% by mass or more and 25% by mass or less, and more preferably contains:
    acetic acid (on CH$_3$COOH basis): 60% by mass or more and 75% by mass or less;
    hydrofluoric acid (on HF basis): 4% by mass or more and 5.5% by mass or less;
    nitric acid (on HNO$_3$ basis): 10% by mass or more and 16% by mass or less; and
    iodine (on I$_2$ basis): 1% by mass or more and 1.5% by mass or less,
and has a water content of 2% by mass or more and 15% by mass or less. The solution temperature is appropriately adjusted to 40° C. to 55° C., both ends inclusive, and the immersing time is appropriately 40 seconds to 60 seconds, both ends inclusive.

Using the above etching solution for surface roughening allows to proceed irregularity formation prominently with an anisotropic etching principle so as to form the surface roughening projections efficiently and inexpensively on the first main surface of the GaP light extraction layer, even though the {100}$_B$ surface having a high existence rate of P atoms appears on the first main surface of the GaP light extraction layer 90. It also allows to conduct surface roughening with homogeneity to a plurality of the {100} surfaces composing the side faces 90S (and also 20S) even tough the Ga-rich {100}$_A$ surfaces appear on some of them, and the P-rich {100}$_B$ surfaces appear on some of the rest.

Each light emitting device chip completed the surface roughening described above is bonded, on the second main surface side thereof, to a metal stage while placing an Ag paste layer in between, followed by, as shown in FIG. 1, connection of a bonding wire 17 to the light-extraction-side electrode 9, and formation of an unillustrated mold portion composed of an epoxy resin, to thereby complete a final form of the light emitting device.

Figure 11:
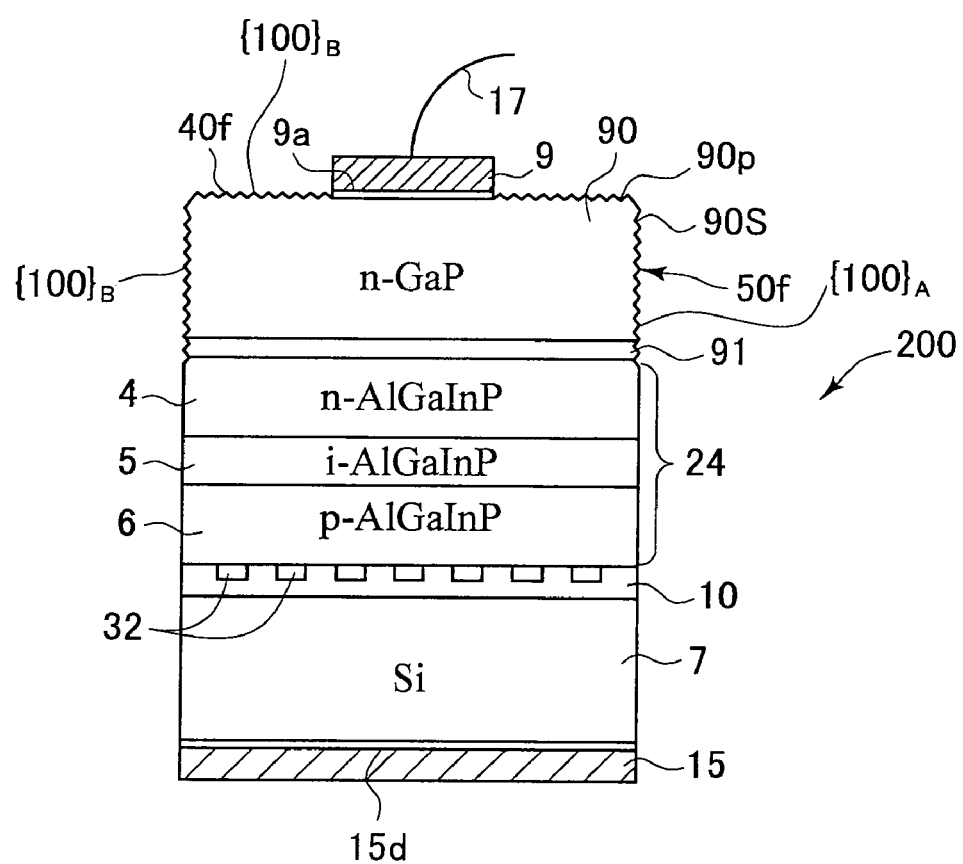
FIG. 11 is a schematic sectional side elevation showing a first modified example of the light emitting device shown in FIG. 1.

Paragraphs below will describe various modified examples of the light emitting device of this invention (any components identical to those in the light emitting device 100 shown in FIG. 1 will be given with the same reference numerals so as to avoid detailing, and only different aspects will be explained). A light emitting device 200 shown in FIG. 11 is configured as having a metal reflective layer 10 composed of Au or Ag (or any alloys having these elements as major components), in place of forming the p-type GaP base layer 20 on the second main surface side of the light emitting layer section 24 of the light emitting device in FIG. 1. Beam of light emitted from the light emitting layer section 24 is reflected on the metal reflective layer 10 back towards the main light extraction area side, successfully realizing a light emitting device having a strong directionality on the main light extraction area side. In this embodiment, an electro-conductive Si substrate 7 is bonded to the second main surface of the light emitting layer section 24, while placing the metal reflective layer 10 in between. The Si substrate 7 has the back electrode 15 formed on the second main surface side thereof, wherein a bond-assisting metal layer 15d is formed in between over the entire second main surface of the Si substrate 7, because the back electrode 15 does not form a reflective surface. Between the metal reflective layer 10 and the light emitting layer section 24, a dot-patterned, alloyed contact layer 32 (typically composed of an AuBe alloy) is formed in a distributed manner.

What is claimed is:

1. A method of fabricating a light emitting device comprising:
    a light emitting device wafer fabricating step of fabricating a light emitting device wafer having a light emitting layer section based on a double heterostructure in which a first-conductivity-type cladding layer, an active layer and an second-conductivity-type cladding layer, each of which being composed of a compound having a composition allowing lattice matching with GaAs, out of compound expressed by formula (Al$_x$Ga$_{1-x}$)$_y$In$_{1-y}$P (where, $0 \leq x \leq 1$, $0 \leq y \leq 1$), are stacked in this order, and a GaP light extraction layer disposed, having a main surface, on a side not faced to the active layer, of the first-conductivity-type cladding layer of the light emitting layer section as a first main surface, so that on the first main surface of the light emitting layer section a {100} surface appears on the first main surface of itself;

a surface roughening step of forming surface roughening projections by etching the first main surface of the GaP light extraction layer, using an etching solution for surface roughening; and a dicing step of dicing the light emitting device wafer to light emitting device chips, wherein on the light emitting device wafer fabricating step, the GaP light extraction layer is formed to have a principal crystal axis thereof off-angled in a degree range of 1° to 25°, both ends inclusive, from <100> direction, so as that a P-rich off-angled {100} surface, having a higher existence rate of P atoms than an exact {100} surface, appears on the first main surface thereof, the etching solution for surface roughening at the surface roughening step contains:

acetic acid (on $CH_3COOH$ basis): 40% by mass or more and 75% by mass or less;

hydrofluoric acid (on HF basis): 2% by mass or more and 8% by mass or less;

nitric acid (on $HNO_3$ basis): 4.5% by mass or more and 16% by mass or less; and iodine (on $I_2$ basis): 0.85% by mass or more and 1.5% by mass or less, and has a water content of 2% by mass or more and 25% by mass or less.

2. The method of fabricating the light emitting device as claimed in claim 1, wherein the first-conductivity-type cladding layer and the GaP light extraction layer are both formed as n-type semiconductor layers.

3. The method of fabricating a light emitting device as claimed in claim 1, wherein the surface roughening etching solution has a mass composition ratio of (acetic acid/(hydrofluoric acid+nitric acid)) set to 2 to 10, both ends inclusive.

4. The method of fabricating a light emitting device as claimed in claim 1, wherein the surface roughening etching solution has a mass composition ratio of (hydrofluoric acid/acetic acid) set to 0.03 to 0.13, both ends inclusive.

5. The method of fabricating a light emitting device as claimed in claim 1, wherein a degree of the off-angle ranges from 10° to 25°, both ends inclusive.

6. The method of fabricating a light emitting device as claimed in claim 1, wherein the light emitting device wafer fabricating step includes a light-extraction-side electrode forming step of covering a part of the first main surface of the GaP light extraction layer with a light-extraction-side electrode mainly composed of Au, having an area not covered with the light-extraction-side electrode of the first main surface as a main light extraction area, on the surface roughening step, the surface roughening projections are formed on the main light extraction area by contacting the main light extraction area as well as the light-extraction-side electrode with the etching solution for surface roughening.

7. The method of fabricating a light emitting device as claimed in claim 1, wherein the surface roughening step is conducted after the dicing step, and the etching solution for surface roughening contacts the first main surface as well as side faces of the GaP light extraction layer, so as to form the surface roughening projections on the side faces.

8. The method of fabricating a light emitting device as claimed in claim 7, wherein the dicing step is conducted so as to have {100} surface appearing on the side face of the GaP light extraction layer of the light emitting device chip.

* * * * *